United States Patent
Michii et al.

(10) Patent No.: US 6,583,511 B2
(45) Date of Patent: Jun. 24, 2003

(54) SEMICONDUCTOR DEVICE AND A METHOD OF PRODUCING THE SAME

(75) Inventors: Kazunari Michii, Tokyo (JP); Tatsuhiko Akiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/903,629

(22) Filed: Jul. 13, 2001

(65) Prior Publication Data

US 2002/0173076 A1 Nov. 21, 2002

(30) Foreign Application Priority Data

May 17, 2001 (JP) .......................... 2001-147476

(51) Int. Cl.[7] .................... H01L 23/48; H01L 23/52; H01L 29/40
(52) U.S. Cl. ....................... 257/777; 257/666
(58) Field of Search ................... 257/666, 686, 257/690, 723, 724, 777, 772, 782, 784

(56) References Cited

U.S. PATENT DOCUMENTS 6,337,521 B1 * 1/2002 Masuda 6,353,265 B1 * 3/2002 Michii

FOREIGN PATENT DOCUMENTS

| JP | 8-181165 | 7/1996 |
|----|----------|--------|
| JP | 11-163255 | 6/1999 |

* cited by examiner

Primary Examiner—Hoai Ho
Assistant Examiner—Phuc T. Dang
(74) Attorney, Agent, or Firm—Leydig, Voit & Mayer, Ltd.

(57) ABSTRACT

A laminated semiconductor chip assembly fabricated by fixing back surfaces of first and second semiconductor chips, respectively having principal surfaces and back surfaces, to each other. Each of the principal surfaces of the laminated semiconductor chip assembly is fixed to a corresponding surface of a lead frame. A standing linear portion of a metallic wire on a ball bond side is pulled parallel to a side surface of the semiconductor chip in its thickness direction and a side surface of the inner lead in its thickness direction, and subjected to wire bonding. The formed semiconductor chip assembly is covered by a sealing resin so that an outer lead protrudes from the sealing resin. Thus, the semiconductor device can be made thin, cost can be reduced, and quality can be improved to increase capacities of electronic equipment.

2 Claims, 10 Drawing Sheets

SEMICONDUCTOR DEVICE AND A METHOD OF PRODUCING THE SAME

BACKGROUND OF THE INVENTION

1. Field of the Invention

The present invention relates to a technology effective for tendencies toward high capacities and thin bodies of semiconductor devices.

2. Discussion of Background

In accordance with a tendency of high capacities of memory ICs in accordance with a tendency of a variety of functions of electronic equipments, a semiconductor device, called Multi Chip Package (MCP), which is formed by two semiconductor chips sealed by a sealing material, is developed.

Figure 10:
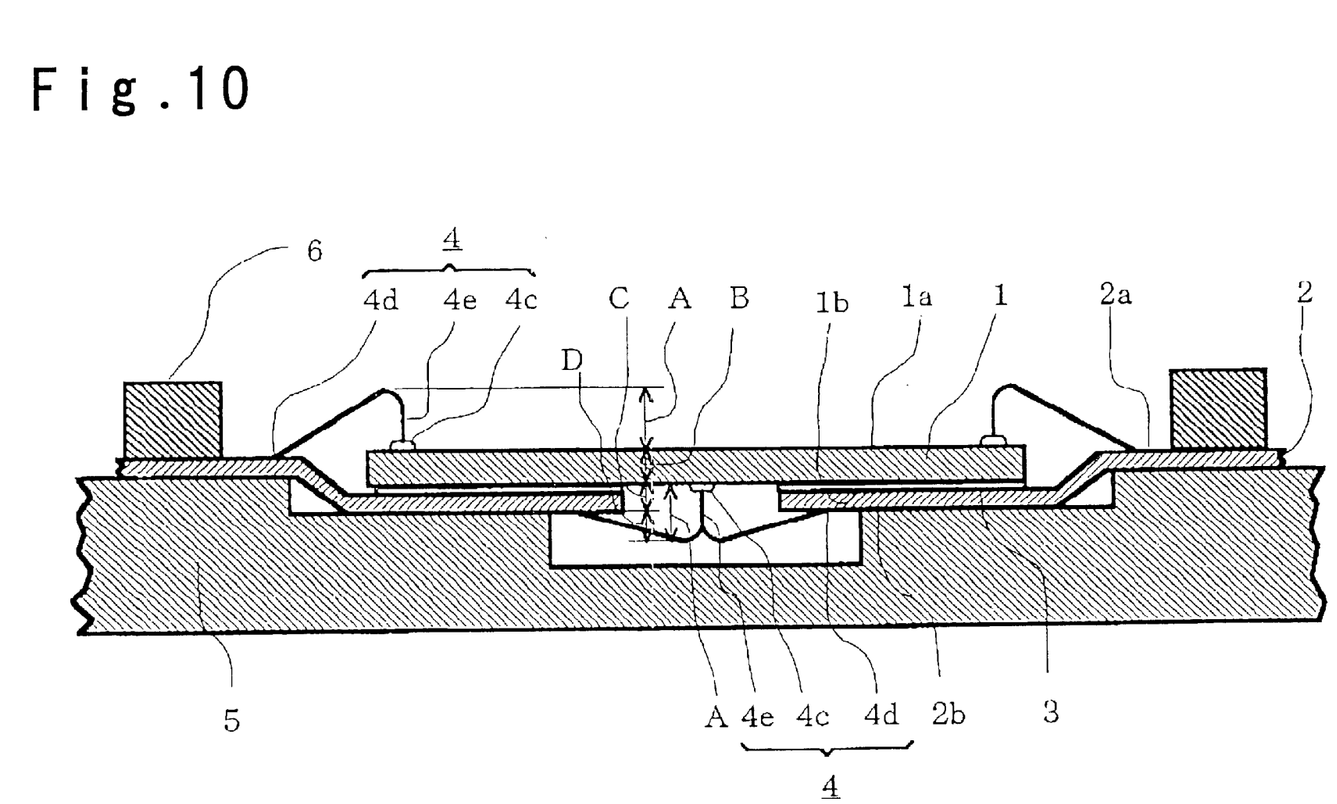
FIG. 10 is a cross-sectional view of a conventional semiconductor device in a wire bonding process.

FIG. 10 is a cross-sectional view in a process of wire bonding for manufacturing a conventional MCP, disclosed in Japanese Unexamined Patent Publication JP-A8-181165. To one surface, i.e. an active surface 1b, downward positioned in FIG. 10, of a double-sided semiconductor chip 1 having an active surface 1a and the active surface 1b, a single surface 2a of an inner lead, upward positioned in FIG. 10, is fixed by a bonding material 3. One end of an Au wire 4 is connected to pads (not shown), formed on the active surface 1a and the active surface 1b, by a ball bond 4c. The other end of the Au wire is connected to the one side 2a of the inner lead and the other side 2b of the inner lead by a stitch bond 4d. This wire bonding method is called a forward wire bonding method, by which the wire is subjected to ball bonding to a pad on a semiconductor chip and to stitch bonding to a lead frame.

FIG. 10 is a cross-sectional view in a stage before a process of sealing by a sealing resin. In order to cover a top end portion of the Au wire 4 to seal by the sealing resin, a height A of the top end portion of the Au wire upward extended from the active surface 1a, a thickness B of the double-sided semiconductor chip 1, and a dimension A to a top end portion of the Au wire downward extended from the active surface 1b determine a thickness as a sum, i.e. A+B+A, under a state that MCP is sealed.

Further, in the conventional semiconductor device, a step is formed in the inner lead 2 so as to reduce a difference between heights of the ball bond 4c and the stitch bond 4d in order to prevent a contact between the Au wire 4 and an outer periphery of the semiconductor chip 1.

However, in the above-described conventional semiconductor device, the step of the inner lead is formed by bending. Therefore, a tolerance of ±10 μm exists in the step of the inner lead, formed at a time of mass production. On the other hand, the inner lead 2 is deformed as much as an actual tolerance between the jig and the inner lead when the inner lead 2 is tightened and fixed for wire bonding by a supporting jig machined to have predetermined dimensions and a lead securing jig 6 machined to have predetermined dimensions. When the wire bond is completed and the securing jigs are removed, the inner lead shows a returning motion by an amount of a forcible displacement of the inner lead. By this motion of the inner lead, fixed ends of the Au wire 4, already wire bonded, namely the ball bond 4c and the stitch bond 4d, are displaced, whereby a quality in the wire bonding process becomes unstable.

Further, a dimension of the step of the inner lead having the bending tolerance makes the quality and the sealing process unstable because a cross-sectional area of a flow path of a resin is changed.

On the other hand, by providing the ball bond 4c in the pad positioned on the active surface 1b and the stitch bond in the inner lead 2b, it is impossible to make the thickness after sealing thin because even though a step having a dimension C, obtained by adding the plate thickness of the inner lead 2 to the thickness of the bonding material 3, is provided between the ball bond and the stitch bond, the inner lead is formed on one of the surfaces, i.e. the active surface, of the double-sided semiconductor chip, and is subjected to the forward wire bonding in the pad, the total thickness of the semiconductor (MCP) depends on the sum A+B+A, of the height A of the loop, upward extended from the active surface 1a, the thickness B of the double-sided semiconductor chip 1, and the dimension A of the loop of the Au wire, downward extended from the active surface 1b.

Further, the supporting jig 5 used for wire bonding does not deform the two surfaces having the steps and the Au wire 4 by simultaneously supporting two surfaces of the back surfaces 2b of the inner lead 2, bent to have the two steps, as illustrated in FIG. 10. Therefore, a third recess is further required to prevent a contact of the Au wire 4, downward protruded by the dimension D from the back surface 2b of the inner lead 2. Accordingly, it is necessary to prepare the supporting jig 5 having three step surfaces, and, it is technically difficult to process the two surfaces having the steps so as to simultaneously support the two back surfaces 2b of the inner lead 2, having the tolerances, whereby such a process is complicated and increases a cost.

Further, when forward wire bonding is conducted, it is impossible to make the double-sided semiconductor chip without using a semiconductor chip of a center pad arrangement, of which pad is arranged in a center of an active surface, and a semiconductor chip of a peripheral pad arrangement, of which pad is arranged in a periphery of the active surface. Therefore, it is impossible to make a double-sided semiconductor chip achieving a requirement that MCP is fabricated by two memory semiconductor chips so as to double a memory capacity.

Further, in order to fabricate MCP using two memory semiconductor chips to double a memory capacity, Japanese Unexamined Patent Publication JP-A-11-163255 discloses that a Lead On Chip (LOC) structure, formed by fixing two sheets of frames to two active surfaces, is adapted, Au wires are subjected to forward wire bonding between pads and corresponding inner leads, and an entirety is covered by a sealing resin.

In this case, as long as the forward wire bonding is adapted, the thickness of an entire MCP is resultantly a sum A+B+A of a height A of a loop of the Au wire, upwardly extended from the active surface 1a, the thickness B of the double-sided semiconductor chip 1, and a dimension A of a loop of the Au wire, downwardly extended from the active surface 1b, whereby it is impossible to reduce the thickness of the MCP in a similar manner to that in Japanese Unexamined Patent Publication JP-A-8-181165.

Further, because two sets of LOC structures, formed by joining an inner lead by a joining agent, are prepared on the active surfaces of the semiconductor chip, two expensive frames are required. Further, in a manufacturing process of integrating the two sets of LOC are bonded back to back, it becomes necessary to add accurate welding for bonding the two sheets of the lead frames with a high accuracy and fixing each other, whereby there is a drawback that a production cost is further increased.

SUMMARY OF THE INVENTION

An object of the present invention to provide a semiconductor device having a thin body by solving the deficiencies of the conventional semiconductor device.

Another object of the present invention is to provide a semiconductor device having a thin body at a low cost.

Another object of the present invention is to provide a method of manufacturing a semiconductor device having a thin body at a low cost with a higher quality.

According to a first aspect of the present invention, there is provided a semiconductor device comprising:

a laminated semiconductor chip including a first semiconductor chip and a second semiconductor chip, respectively having a principle surface being active surfaces having pads and a back surface, which is laminated by fixing the back surface of the first semiconductor chip to the back surface of the second semiconductor chip by a first joining material;

a lead frame integrally formed out of a sheet of a flat plate so as to have an inner lead and an outer lead;

a second joining material;

metallic wires; and a sealing material, wherein a second surface of the inner lead is fixed to the principle surface of the first semiconductor chip by a second joining material, the metallic wire is bonded to the second surface of the inner lead and a pad on the second semiconductor chip by adverse wire bonding, the metallic wire is bonded to the pad on the first semiconductor chip and the first surface of the inner lead by forward wire bonding, the inner lead, the laminated semiconductor chip, the metallic wires, and the second joining material are covered by the sealing resin, and the outer lead is protruded from an interfacial surface of the sealing resin.

According to a second aspect of the present invention, there is provide the semiconductor chip, wherein a memory semiconductor chip is used as the laminated semiconductor chip.

According to a third aspect of the present invention, there is provided a method of manufacturing a semiconductor device comprising:

a first wire bonding step of using a supporting jig having a first supporting surface and a second supporting surface and a lead securing jig having a through hole, of making a second surface of an inner lead be in contact with the first supporting surface of the supporting jig and making a principle surface of a semiconductor chip be in contact with the second supporting surface of the supporting jig, of interposing, tightening, and fixing the inner lead by making the lead securing jig be in contact with the first surface of the inner lead, of bonding an end of a metallic wire to a pad of the semiconductor chip by means of ball bonding in an opening portion of the through hole, and of electrically connecting a standing linear portion of the ball bond to a tip end portion of the first surface of the inner lead by means of stitch bonding by pulling the standing linear portion in parallel with a thickness surface of a tip end portion of the inner lead; and a second wire bonding step of using a supporting jig having a first supporting surface and a second recessed surface and a lead securing jig having a through hole having dimensions larger than dimensions of the semiconductor chip, of making the first surface of the inner lead, processed in the first wire bonding step, be in contact with the first supporting surface of the supporting jig, of interposing, tightening, and fixing the inner lead by making a second surface of the inner lead be in contact with the lead securing jig, of bonding an end of a metallic wire to the second surface of the inner lead by means of ball bonding in an opening portion of the through hole, and of electrically connecting a standing linear portion of the ball bond to a pad of the semiconductor chip by means of stitch bonding by pulling the standing linear portion of the ball bond in parallel with a side surface of the semiconductor chip.

According to a fourth aspect of the present invention, there is provided a method of manufacturing a semiconductor device comprising:

a first wire bonding step of using a supporting jig having a first supporting surface, a second supporting surface, and an elastic material on the second supporting surface, and an lead securing jig having a through hole, of making a second surface of the inner lead be in contact with the first supporting surface of the supporting jig and making a principle surface of a semiconductor chip be in contact with the elastic material, of interposing, tightening, and fixing the first surface and the second surface of the inner lead by making the lead securing jig be in contact with the first surface of the inner lead, and of electrically connecting a pad of the semiconductor chip to a first surface of the lead in an opening portion of the through hole by means of forward wire bonding, and a second wire bonding step of using a supporting jig having a first supporting surface and a second recessed surface and an lead securing jig having a through hole of dimensions larger than dimensions of a semiconductor chip, of making the first surface of the inner lead, processed in the first wire bonding step, be in contact with the first supporting surface of the supporting jig, of interposing, tightening, and fixing the first surface and the second surface of the inner lead by making the lead securing jig be in contact with the second surface of the inner lead, and of electrically connecting the second surface of the inner lead to a pad of the semiconductor chip in an opening portion of the through hole by means of adverse wire bonding.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein.

DETAILED DESCRIPTION OF THE PREFERRED EMBODIMENTS

A detailed explanation will be given of preferred embodiments of the present invention in reference to FIGS. 1 through 9 as follows, wherein the same numerical references are used for the same or similar portions and descriptions of these portions is omitted.

Embodiment 1

In Embodiment 1, a semiconductor device of a thin small out-line package (TSOP) type, in which outer leads are drawn out of two sides among four sides of a substantially hexahedron, formed by sealing two semiconductor chips having center pads by a sealing resin having a thickness of 1 mm, will be described.

A lead frame used in Embodiment 1 is continuously formed so that an inner lead and an outer lead are integral by processing a sheet of thin flat plate by etching or stamping. It is preferable to provide conductive metallic plating such as silver plating, palladium plating, and gold plating on areas subjected to wire bonding on two surfaces forming the inner lead.

The lead frame continuously formed like a sheet of flat plate so that the inner lead and the outer lead are integral means a lead frame, continuously formed on a two-dimensional flat surface in terms of the euclidean geometry so that the inner lead and the outer lead are integral.

Figure 1:
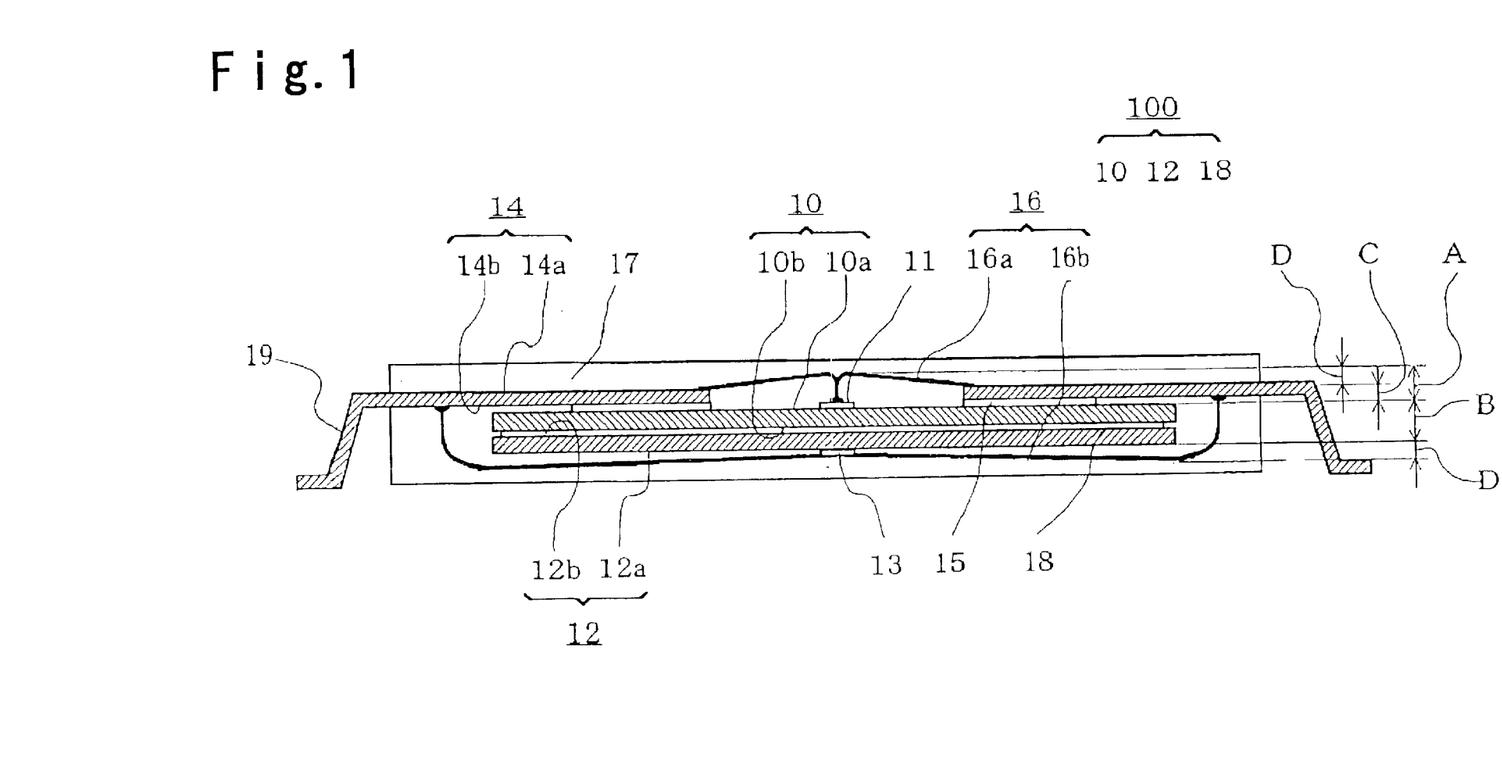
FIG. 1 is a cross-sectional view of a semiconductor device according to Embodiment 1 of the present invention.
Figure 2:
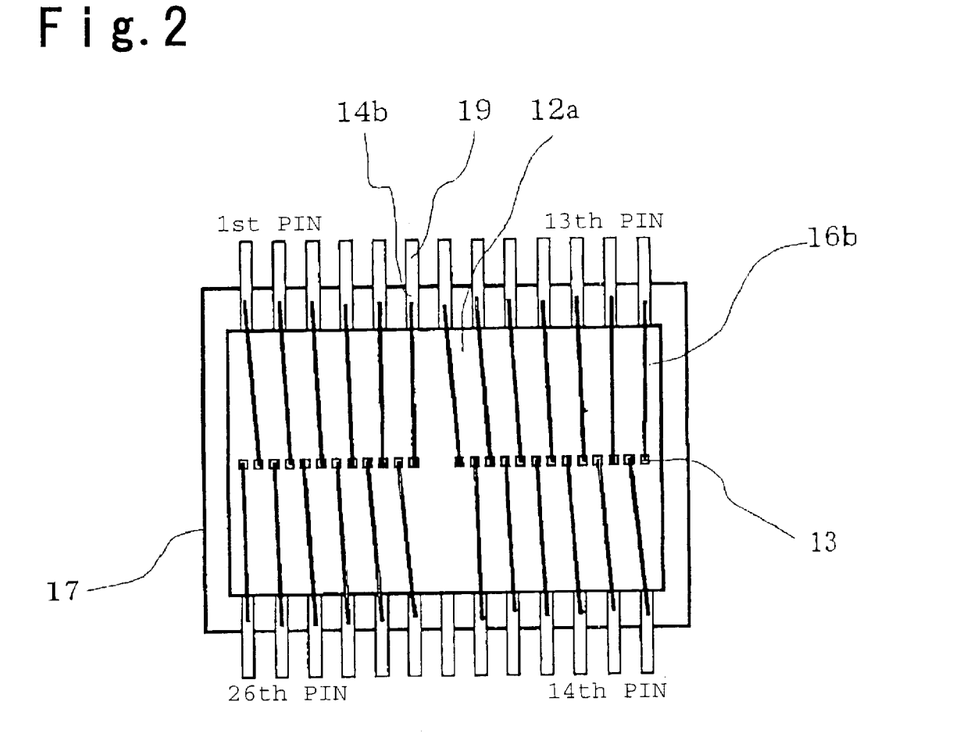
FIG. 2 illustrates a bottom of the semiconductor device illustrated in FIG. 1 in a state that a lower sealing resin is removed.
Figure 3:
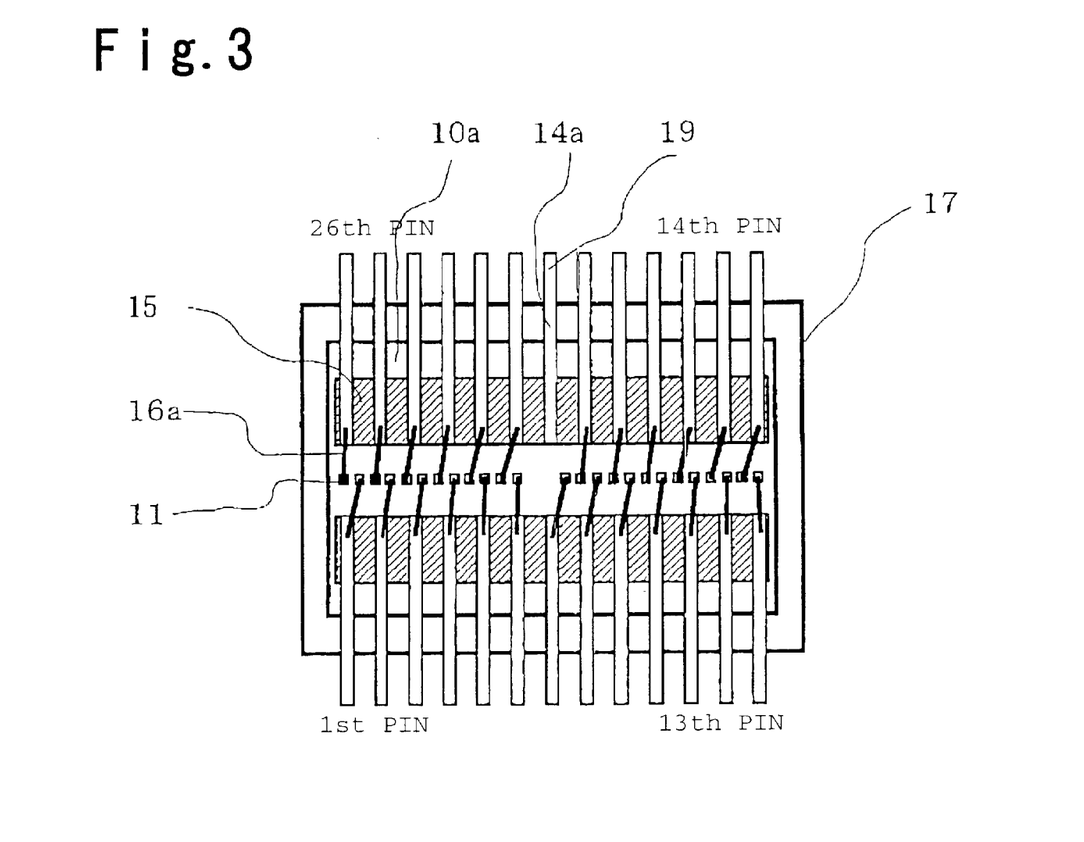
FIG. 3 is a plan view of the semiconductor device illustrated in FIG. 1 in a state that an upper sealing resin is removed.
Figure 4:
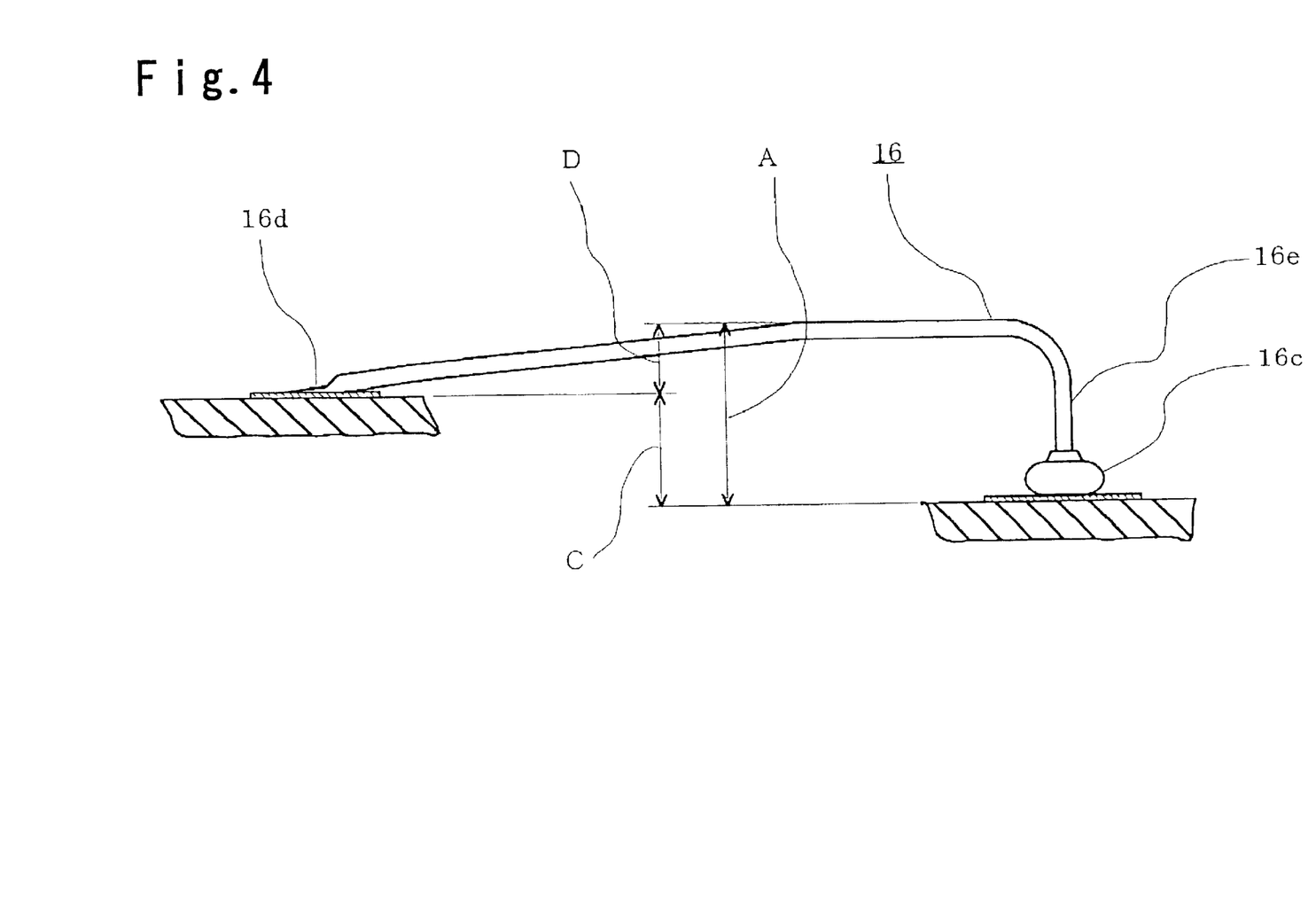
FIG. 4 is a side view of a metallic wire.

FIG. 1 is a cross-sectional view of a semiconductor device according to this embodiment. FIG. 2 illustrates a bottom surface of the semiconductor device illustrated in FIG. 1 in a state that a lower sealing resin is removed. FIG. 3 is a plan view of the semiconductor device illustrated in FIG. 1 in a state that an upper sealing resin is removed. FIG. 4 is a side view of a metallic wire.

As illustrated in FIG. 1, a principle surface 10a of a first semiconductor chip 10 is fixed to one surface, i.e. a second surface 14b of the inner lead in FIG. 1, of the inner lead by a second joining material 15. Further, a back surface 12b of a second semiconductor chip 12 is fixed to a back surface 10b of the first semiconductor chip 10 by a first joining material 18, whereby a laminated semiconductor chip 100 is fabricated.

In FIG. 1, a first surface 14a and a second surface 14b of the inner lead 14, respectively corresponding to a pad 11 and a pad 13, respectively formed in the first semiconductor chip 10 and the second semiconductor chip 12 are shown. As illustrated in FIG. 4, an end 16e of a metallic wire 16a of metallic wires 16 is bonded to a pad 11 by a ball bond 16c, and the other end of the metallic wire 16a is bonded to the inner lead 14a by a stitch bond 16d, wherein such a connection is called forward wire bonding (method), conducted to electrically connect and wire. Further, an end of a lower metallic wire 16b in FIG. 1 is bonded to the inner lead 14b by a ball bond 16c and the other end of the metallic wire 16b is bonded by a stitch bond 16d, wherein such a connection is called adverse wire bonding (method), conducted to electrically connect and wire.

Dimensions affecting the thickness of the semiconductor device will be described in reference of FIGS. 1 and 4. A height difference, i.e. a dimension of a step between the ball bond 16c and the stitch bond 16d is referred to as C. The metallic wire 16 stands from the ball bond 16c, which is fused and joined by applying a thermal energy, a contact force, and a mechanical energy of a supersonic vibration, so as to be pulled up in a standing linear portion 16e, and is bent by about 90°. Thereafter, the metallic wire is horizontally extended to a position of the stitch bond. Then, a thermal energy, a contact force, and a mechanical energy of a supersonic vibration are applied again to the metallic wire to fuse and join by the stitch bond 16d. A dimension from the ball bond to a top end portion, substantially vertically pulled up, of the metallic wire 16, i.e. a loop height, is designated by A. A loop height of the metallic wire 16 from the stitch bond is designated by D.

In Embodiment 1, as illustrated in FIGS. 1 and 2, one end of the metallic wire 16a is bonded to the pad 11 of the first semiconductor chip 10 by ball bonding, and the other end is connected to the first surface 14a of the inner lead 14 by stitch bonding, i.e. forward wire bonding. On the other hand, an end of the metallic wire 16b is bonded to the second surface 14b of the inner lead 14 by ball bonding, and the other end is connected to a pad 13 of the semiconductor chip 12 by stitch bonding, i.e. adverse wire bonding.

After completely wire bonding, the inner lead 14, the semiconductor chips 10 and 12, the metallic wires 16a and 16b, and the first and second joining materials 18 and 15 are covered by a sealing resin 17, and an outer lead 19 is protruded from a sealing interfacial side of the sealing resin 17, and the outer lead 19 is bent and shaped like gull wings, whereby the semiconductor device described in Embodiment 1 and illustrated in FIG. 1 is obtainable.

In Embodiment 1, a dimension from a top of the loop height dimension A of the metallic wire 16a are subjected to forward wire bonding to a top of the loop height of the metallic wire 16b, being a lower end, subjected to adverse wire bonding determines the thickness of the semiconductor device. Therefore, the ball bond of the metallic wire 16b is positioned on the second surface 14b of the inner lead, and the metallic wire 16b is subjected to adverse wire bonding after substantially vertically, i.e. in a vertically downward direction from the second surface 14b of the inner lead, pulling up in parallel with side surfaces, i.e. thicknesses, of the semiconductor chips 10 and 12, whereby a protruding dimension of the metallic wire from the active surface 12a of the semiconductor chip 12 becomes D, wherein the total thickness of the semiconductor device is D+B+A, being a sum of D, the thickness B of the laminated semiconductor chip, and a loop height A.

In the semiconductor device according to Embodiment 1, dimensions of essential components A+B+A, determining the thickness of a conventional semiconductor device, is reduced to A+B+C by C=A−D.

Figure 5:
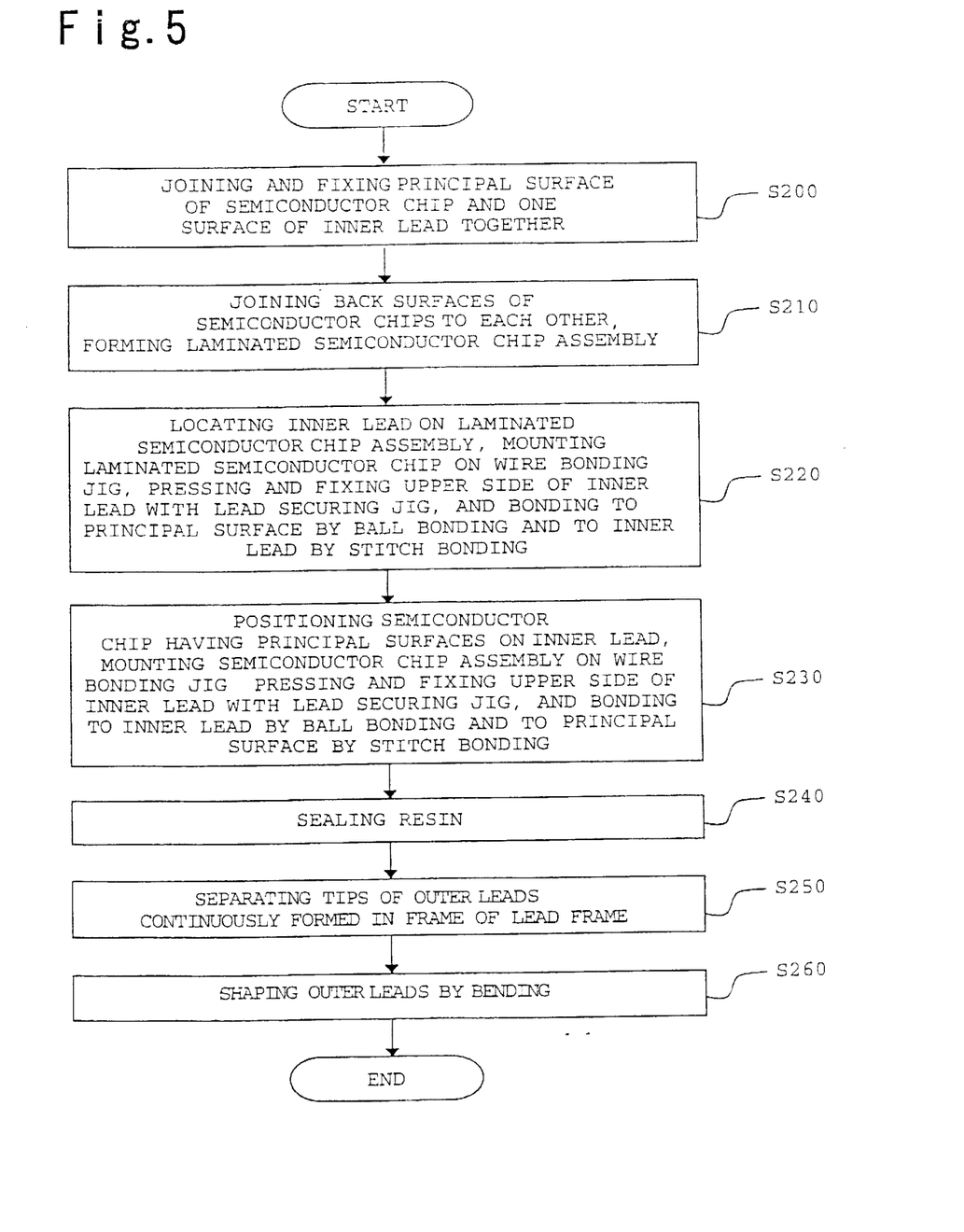
FIG. 5 is a flow chart illustrating a process of manufacturing the semiconductor device according to Embodiment 1 of the present invention.

In the next, a method of manufacturing the semiconductor device according to Embodiment 1 will be described. FIG.

Figure 7:
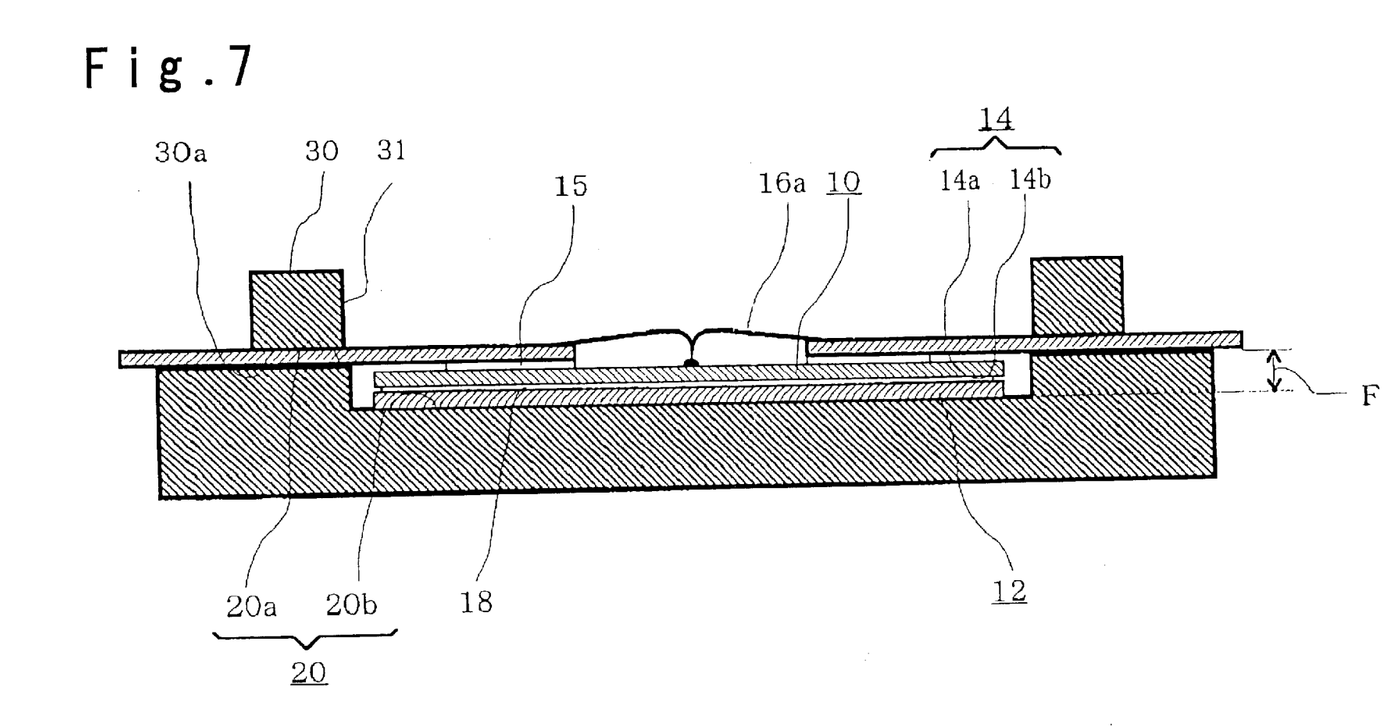
FIG. 7 is a cross-sectional view of the semiconductor device for explaining forward wire bonding in Embodiment 1.
Figure 8:
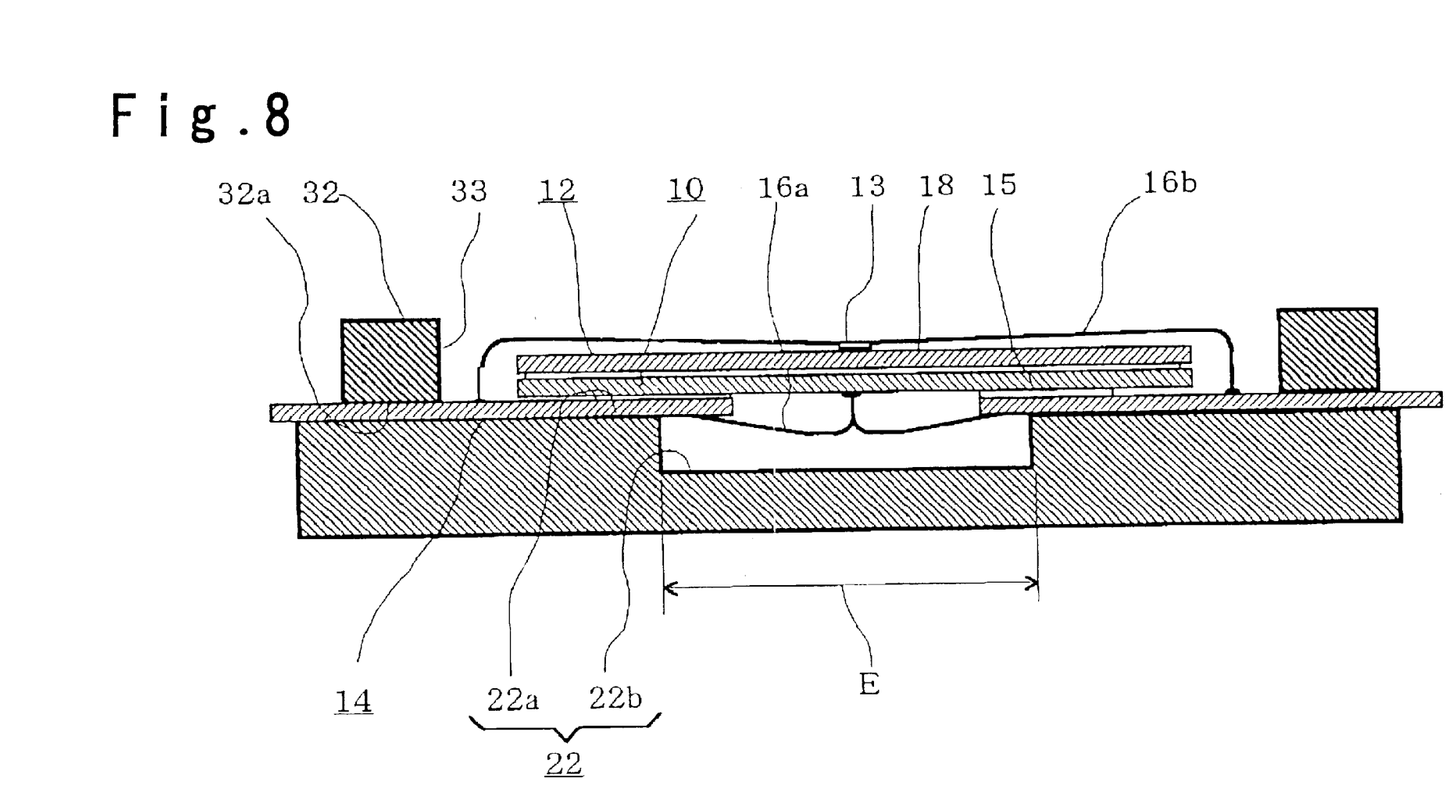
FIG. 8 is a cross-sectional view of the semiconductor device for explaining adverse wire bonding in Embodiment 1.

5 is a flow chart, i.e. a process flow chart, illustrating sequential steps in a process of manufacturing the semiconductor device. FIGS. 6a through 6e are cross-sectional views in the sequential steps in a process of manufacturing the semiconductor device illustrated in FIG. 5. FIG. 7 is a cross-sectional view of the semiconductor device in forward wire bonding. FIG. 8 is a cross-sectional view of the semiconductor device in adverse wire bonding.

Figure 6A:
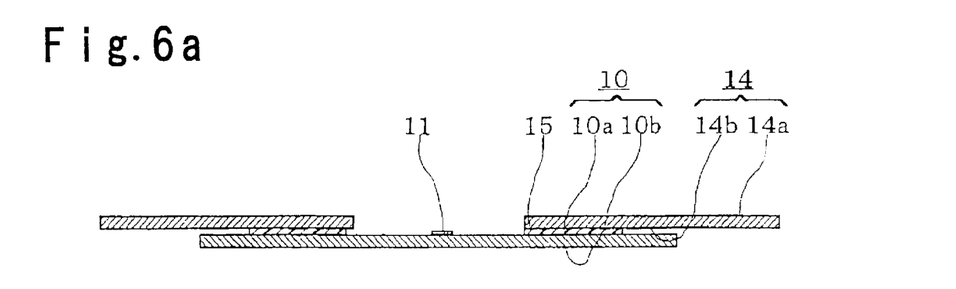
FIG. 6a is a cross-sectional view of the semiconductor device in the process of manufacturing the semiconductor device illustrated in FIG. 5.

As illustrated in FIG. 6a, the back surface 10b of the semiconductor chip 10 is positioned so as to be in contact with a planer supporting jig (not shown), the second joining material 15 is attached to both sides other than an area of the center pad 11 to the principle surface 10a. The second surface 14b of the inner lead 14 is mounted on and joined to the second joining material 15, whereby a first die bonding Step S200 in FIG. 5 is completed in order to evenly and certainly join on entire surfaces of bonding surfaces, it is preferable to mount a planer securing jig (not shown) on the first surface 14a of the inner lead 14 and apply an equal pressure on the planer securing jig. Further, in order to completely join the second joining material 15, it is preferable, when necessary, to add a curing step for completely accelerate the cure by increasing the temperature.

When the first die bonding Step S200 is completed, a condition of a flat surface of the first surface 14a of the inner lead 14 is that, as illustrated in FIG. 3, the second joining material 15 is exposed in gaps between the inner leads 14 adjacent each other, and the principle surface 10a of the semiconductor chip 10 is exposed in areas where the second joining material 15 is not joined, namely an outer peripheral area of the principle surface 10a of the semiconductor chip 10 and a central area of the semiconductor chip, in which the center pad 11 is arranged.

Figure 6B:
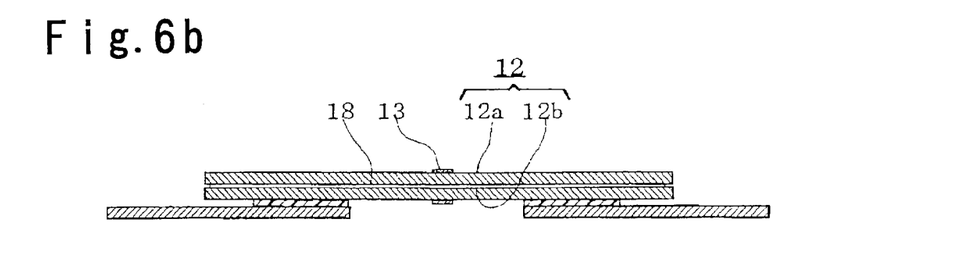
FIG. 6b is a cross-sectional view of the semiconductor device in the process of manufacturing the semiconductor device illustrated in FIG. 5.

In the next, as illustrated in FIG. 6b, the inner lead 14, processed in the first die bonding Step S200, is turned upside down so that the first surface 14a of the inner lead 14 is settled so as to be in contact with the planer supporting jig (not shown), and the first joining material 18 is attached to the back surface 10b of the semiconductor chip. Thereafter, the semiconductor chip 12 to be joined and fixed is joined. For example, the back surface 12b of the semiconductor chip 12 is joined by putting on the first joining material 18 in a state that the center pad 11 of the semiconductor chip illustrated in FIG. 3 is rotated by 180° around the rotational axis of a chip central line, to be arranged, namely a central line parallel to a longitudinal side of the chip in FIG. 3. As illustrated in FIG. 2, the semiconductor device is formed such that pin numbers are the same on left and right sides, and up and down sides are reversed. After completing this joint, a second die bonding step S210 illustrated in FIG. 5 is completed.

In a case that two pieces of the same semiconductor chips are not used, and a laminated semiconductor chip is fabricated in use of semiconductor chips 10 and 12 having different center pad arrangements in a mutually reversed state, as described above, it is needless to say that the semiconductor chips are not joined by rotating by 180° around a rotating axis of a chip center line, i.e. a central line in parallel to a longitudinal side of the chip in FIG. 3, to which the center pads 11 of the semiconductor chip are aligned.

In the second die bonding step S210, it is preferable to apply a uniform pressure on the planer securing jig (not shown) to ensure the joint after mounting the semiconductor chip 12 on the first joining material 18 and further mounting a chip protecting tape (not shown) thereon, in terms of a protection of the principle surface 12a of the semiconductor chip. Further, it is possible to add a curing step for increasing a temperature to promote a complete curing when necessary in view of a complete adhesion of the second joining material 15. The above-described sequential curing step can be conducted together after the first die bonding step S200 and the second die bonding step S210 are completed.

In the next, as illustrated in FIG. 7, a supporting jig 20 and an lead securing jig 30 are prepared, wherein the supporting jig 20 has a first supporting surface 20a, and a second supporting surface 20b, being a recessed bottom surface formed within an area of the supporting surface 20a, recessed by a step dimension of F, and the lead securing jig 30 has a securing surface 30a, and a through hole 31 formed within an area of the securing surface 30a. Although the width of the recessed bottom surface of the securing jig 20 is substantially the same as the width of the through hole 31, the relationship is not limited thereto, and the width of the through hole 31 formed in the securing jig 30 may be sufficient to include positions of the metallic wire 16a to be stitch bonded inside the through hole.

After putting the second surface 14b of the inner lead 14 processed in the die bonding steps S200 and S210 on the first supporting surface 20a of the supporting jig 20, and simultaneously putting the principle surface 12a of the semiconductor chip 12 on the second supporting surface 20b so as to be in contact, the securing surface 30a of the lead securing jig 30 is put on the first surface 14a of the inner lead so as to be in contact, and the inner lead 14 is interposed between the supporting jig 20 and the lead securing jig 30 so as to be tightened and fixed.

Thereafter, the ball bond 16c is formed on the pad 11 of the semiconductor chip 10 within an opening area of the through hole 31, the standing linear portion 16e of the ball bond is pulled up in parallel to a thickness side of a tip end portion of the inner lead, and the metallic wire is bonded to the first surface 14a of the inner lead 14, corresponding to the pad 11, by means of the stitch bond 16d to electrically connect, wherein this connection is called forward wire bonding. Thus a first wire bonding step S220 illustrated in FIG. 5 is completed.

Figure 6C:
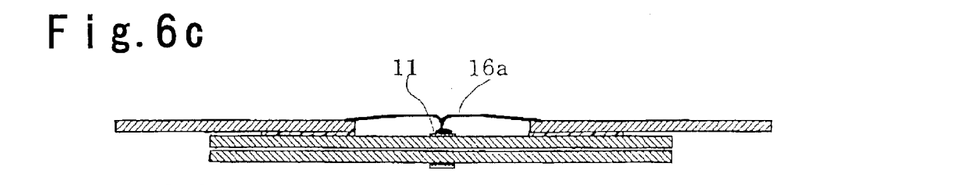
FIG. 6c is a cross-sectional view of the semiconductor device in the process of manufacturing the semiconductor device illustrated in FIG. 5.
Figure 6D:
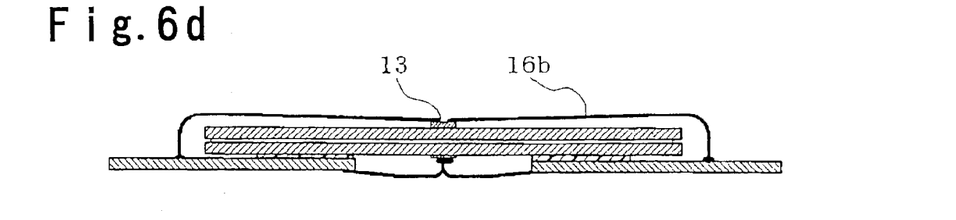
FIG. 6d is a cross-sectional view of the semiconductor device in the process of manufacturing the semiconductor device illustrated in FIG. 5.

A side view after the first wire bonding step S220 is illustrated in FIG. 6c. FIG. 3 illustrates the state in FIG. 6c viewed from a side, in which the metallic wire is connected by wire bonding.

In the next, as illustrated in FIG. 8, a supporting jig 22 and a lead securing jig 32 are prepared, wherein the supporting jig 22 has a first supporting surface 22a and a second recessed surface 22b within an inner area of the first supporting surface 22a having a dimension E, and the lead securing jig 32 has a securing surface 32a for securing the second surface 14b of the inner lead 14 and a through hole 33 having a dimension exceeding an area of the semiconductor chips 10 and 12 and an outer peripheral side thereof to be ball bonded.

The first surface 14a of the inner lead 14 processed in the first wire bonding step S220 is put on the first supporting surface 22a of the supporting jig 22 so as to be in contact. A top end portion of the metallic wire 16a, protruding from the first surface 14a of the inner lead, is registered so as to be within an area of the dimension E of the recessed surface 22b.

In the next, the securing surface 32a of the lead securing jig 32 is put on the second surface 14b of the inner lead so as to be in contact, and the inner lead 14 is interposed between the supporting jig 22 and the securing jig 32 so as to be tightened and fixed. Thereafter, the metallic wire 16b is bonded to the pad 13 of the semiconductor chip 12, corresponding to the second surface 14b of the inner lead, in the area of the opening portion of the through hole 33 by means of adverse wire bonding, wherein a second wire bonding step S230 illustrated in FIG. 5 is completed.

In the second wire bonding step S230, because a portion of the laminated semiconductor chip in the dimension E of the second recessed surface 22b receives a stress equal to a double-end supported beam model having stitch bonding point as a load point, the length of the beam E, and end portions of the recess as two supporting points when the stitch bond 16d is formed on the pad 13 to connect the inner lead 14 with the laminated semiconductor chip in the dimension E of the second recessed surface 22b illustrated in FIG. 8, whereby it is preferable to reduce the dimension E of the supporting jig 22.

Because the metallic wire 16a is subjected to the forward wire bonding in the first wire bonding step S220, the dimension E is reduced as small as possible so as to include the first surface 14a of the lead frame 14 having the stitch bond 16d within the dimension E. Further, the depth of the second recessed surface 22b is larger than the dimension D from the stitch bonding point illustrated in FIG. 4. Therefore, the recessed surface 22b may be a through hole.

Figure 6E:
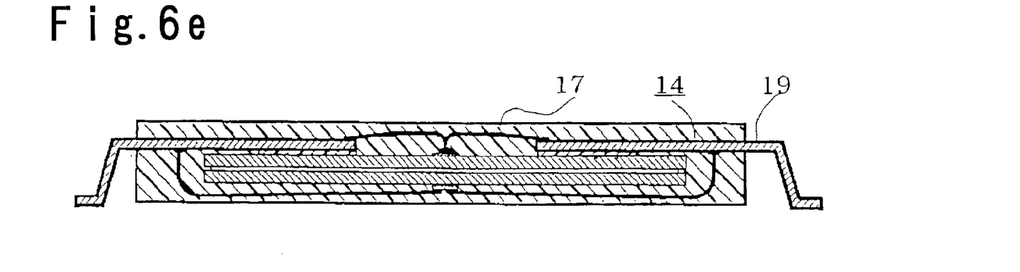
FIG. 6e is a cross-sectional view of the semiconductor device in the process of manufacturing the semiconductor device illustrated in FIG. 5.

When the first and second wire bonding steps are completed, as illustrated in FIG. 6e, the inner lead, the laminated semiconductor chip, the first and second joining materials, and the metallic wire are sealed by the sealing resin 17, whereby a sealing step S240 illustrated in FIG. 5 is completed. The sealing resin used in Embodiment 1 is not specifically limited as long as a resin developed for a semiconductor device. Further, it is unnecessary to newly design an upper metallic die and a lower metallic die used in the sealing step S240 (molding step) because standard metallic dies for a conventional semiconductor device can be commonly used.

In the next, a frame having a single column or multi columns arranged like a matrix is used to seal a plurality of semiconductor devices at once. Thereafter, it is necessary to individually separate the semiconductor devices after the molding step S240. Because tip end portions of outer leads are continuously formed in a lead frame portion (not shown), the tip end portion of the outer leads are separated from the lead frame portion by a cutting means such as laser processing and machine work, whereby an individualizing step S250 is completed.

Finally, the outer leads 19 are shaped like gull wings as illustrated in FIG. 6e, whereby a lead shaping process S260 is completed. After completing the above-described steps, a semiconductor device having a double memory capacity and a thin thickness (MCP) illustrated in FIG. 1 is obtainable.

As described, although the semiconductor device according to Embodiment 1 is fabricated by using the laminated semiconductor chip, formed by laminating the two memory semiconductor chips having the center pads, within the single package to double the memory capacity, by fabricating a laminated semiconductor chip by a semiconductor chip and a memory semiconductor chip having a center pad, respectively having different functions, it is possible to obtain a laminated semiconductor device (MCP) having a thin sealing resin, to which a memory capacity and functions are added.

Further, when the step is formed between the stitch bond and the ball bond, as illustrated in FIG. 4, the stitch bond is positioned between the top end portion of the metallic wire 16b and the ball bond, and forward wire bonding or adverse wire bonding is selected to satisfy A=C+D. In this case, the thickness of the sealing resin can be improved not only in TSOP but also in TQFP or other plastic packages to demonstrate similar effects. Further, an effect of reducing the thickness of the sealing resin can be demonstrated even in a semiconductor device, constructed by a tape frame and a laminated substrate frame such as BGA and CSP packages.

Further, when the center pads of the first and second semiconductor chips are arranged in same directions on right and left sides, and standard pins, connected to the inner leads, are inversed upside down, the pad of the first semiconductor chip and the pad of the second semiconductor chip having same phases or same electrical potentials in terms of a positional relationship among a power source, a ground, and I/O inner leads, can be commonly used. Therefore, it becomes easy to commonly use the inner lead, the number of the inner leads can be reduced, and accordingly the number of the outer leads can be reduced, whereby a size of the semiconductor device in its width direction can be reduced.

Further, since it is necessary to increase the step between the center pad and the inner lead, respectively of the second semiconductor chip, and the length of the metallic wire, there are difficult problems for avoiding a contact between the metallic wire and an edge of the semiconductor chip. However, in use of adverse wire bonding to position a portion, possibly being in contact with the edge of the semiconductor chip, in the top end position of the metallic wire, the contact between an outer peripheral edge of the semiconductor chip and the metallic wire is easily avoidable.

Further, in Embodiment 1, the second die bonding step S210 is conducted after the first die bonding step S200 in FIGS. 5 and 6. However, it is possible to conduct the first die bonding step S200 after the second die bonding step S210 so as to bond the active surface on one side of the laminated semiconductor chip to the tip end portion of the inner lead by the second joining material after the laminated semiconductor chip is formed, whereby an effect similar to that in Embodiment 1 is demonstrated.

Further, a back surface of a semiconductor chip having a center pad is fixed to a back surface of a semiconductor chip having a peripheral pad, respectively having different dimensions, and the semiconductor chip having the center pad is bonded by forward wire bonding and the semiconductor chip having the peripheral pad is bonded by adverse wire bonding, whereby effects similar to those in Embodiment 1 are demonstrated.

It is impossible to avoid surface roughness of the first surface and the second surface of the supporting jig 20 described in Embodiment 1 being 6 µm protrusions and recesses in high-precision processing according to the definition and expression of the surface roughness, JIS B0601. Even though the second supporting surface illustrated in FIG. 7 is polished, 3 µm protrusions and recesses are unavoidable. By directly putting the principle surface 12a of the semiconductor chip 12 on the second surface 20a of the supporting jig 20 to bond by wire bonding, there is a danger that a polyimide insulating film (not shown) on the principle surface 12a is damaged. At this time, a material having a low elasticity such as Teflon in a form of a tape or a liquid is attached to or coated on the second surface 20a of the supporting jig 20, whereby effects similar to those in Embodiment 1 are demonstrated. At this time, if the thickness of the material having the low elasticity in a state that it is attached to the second surface exceeds the surface roughness of the supporting jig 20, for example 100 µm, effects similar to or better than those in Embodiment 1 are demonstrated.

Embodiment 2

A method of manufacturing a semiconductor device according to Embodiment 2 of the present invention has characteristics that a supporting jig used in a first wire bonding step S220 does not damage a polyimide insulating film on a semiconductor chip at a time of wire bonding by a material having a low elasticity formed on a second surface of the supporting jig.

Figure 9:
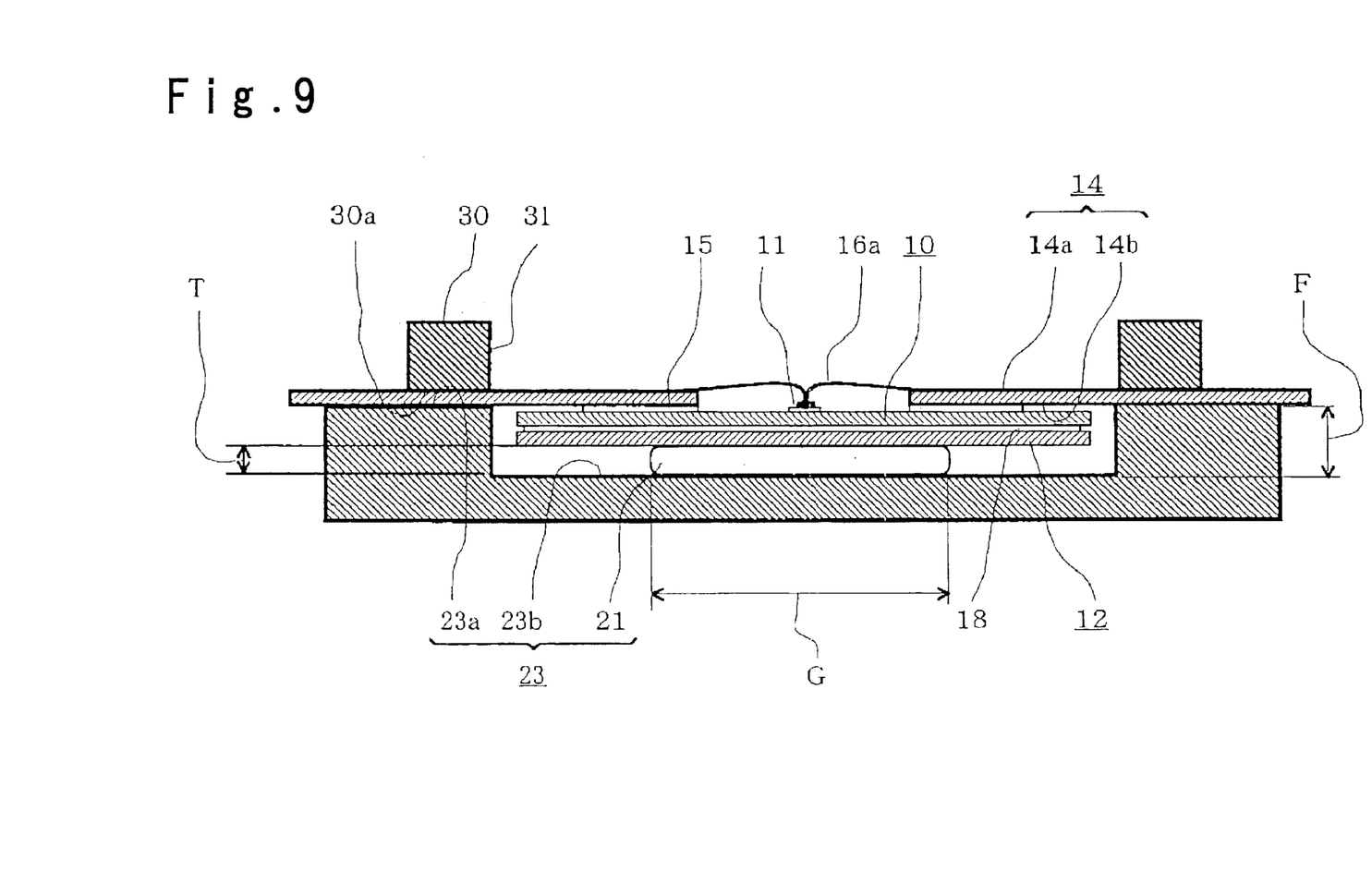
FIG. 9 is a cross-sectional view of a semiconductor device for explaining forward wire bonding in Embodiment 2.

FIG. 9 is a cross-sectional view illustrating a forward wire bond in the method of manufacturing the semiconductor device according to Embodiment 2 of the present invention.

The method of manufacturing the semiconductor device according to Embodiment 2 will be described based on a flow of the steps illustrated in FIG. 5. In FIG. 5, after finishing a first die bonding step S200 and a second die bonding step S210, as illustrated in FIG. 9, a supporting jig 23 having a first supporting surface 23a, a second supporting surface 23b, and an elastic material 21 located on the second supporting surface 23b, and a lead securing jig 30 having a through hole 31 and a securing surface 30a are prepared at a time of conducting second wire bonding. In FIG. 9, a through hole substantially same as a recess in the supporting jig 23 is shown. However, it is not limited thereto, and the through hole 31 formed in the securing jig 30 as a dimension that stitch bond of a metallic wire 16a is included in the through hole.

A second surface 14b of an inner lead 14, processed in the first die bonding step S200 and the second die bonding step S210, is mounted on the first supporting surface of the supporting jig 23. At the same time, a principle surface 12a of a semiconductor chip 12 is put on the elastic material 21 so as to be in contact. Thereafter, the securing surface 30a of the lead securing jig 30 is put on the first surface 14a of the inner lead 14. Thereafter, the first surface 14a and the second surface 14b of the inner lead 14 are interposed between the supporting jig 23 and the lead securing jig 30 so as to be tightened and fixed.

Thereafter, within an opening area of an opening portion 31 of the through hole, formed in the lead securing jig 30, a pad 11 of the semiconductor chip 10 is electrically connected to the first surface 14a of the inner lead 14, corresponding thereto, by forward wire bonding, whereby the first wire bonding step S220 is completed.

Thereafter, in an order illustrated in FIG. 5, a second wire bonding step S230, a molding step S240, an individualizing step S250, and a lead forming step S260 are processed in this order, whereby sequential steps for processing are completed.

After completing the above-described steps, the semiconductor device having a thin sealing resin, in which a laminated semiconductor chip fabricated by two semiconductor chips having same dimensions and same center pads, illustrated in FIG. 1, is obtainable.

In a structure of the supporting jig 23 described in Embodiment 2, a step F of the second supporting surface 23b recessed from the first supporting surface 23a is larger than the step F of the supporting jig 20 described in Embodiment 1 by the thickness of the elastic material 21.

A characteristic of the elastic material 21 is selected by a longitudinal modulus of elasticity in a wire bonding temperature around 240° C. and a heat resistance in the temperature. Hereinbelow, a procedure of determining dimensions of the elastic material 21 will be described.

When an end of a metallic wire 16a is bonded to the center pad 11 of the semiconductor chip 10 by a ball bond 16c, the elastic material, positioned just below the ball bond receives a compression load. On the other hand, when the end of the metallic wire 16a is bonded to the first surface 14a of the inner lead 14 by a stitch bond 16d, the elastic member similarly receives a compression load because the elastic material 21 is positioned just below the stitch bond.

Therefore, the width Q of the elastic material 21 is preferably a width that the metallic wire 16a includes a stitch bond illustrated in FIG. 9. As illustrated in FIG. 9, when the width of the elastic material is Q mm, a contact area of the elastic material, being in contact with the principle surface 12a of the semiconductor chip, is the contact area $S=L\times W$ mm$^2$, where the length of a side in a direction perpendicular to the dimension Q is L mm.

Therefore, the thickness of the elastic material 21 is required to be, for example, relative roughness of a surface subjected to machine work of 3 μm or more, in the supporting jig 23. More preferably, the thickness is 200 times of the relative roughness, (i.e. 0.6 mm) or more. Provided that the thickness of the elastic material 21 is T mm, a spring constant K in a compressing direction of the elastic material is a function of a longitudinal modulus of elasticity E and dimensions L, T, and Q, and the spring constant $K=E\times L\times Q/T$. When the spring constant K is determined, a deviation δ is obtainable from $\delta=F/K$, with respect to a load F. On the contrary, when the deviation δ is suppressed to be a predetermined value, because a load $F=\delta\times K=\delta\times E\times L\times Q/T$, whereby a most suitable thickness of the elastic material is $T=\delta\times E\times L\times Q/F$, when the load F and the deviation δ, W, and Q are determined.

In the next, a material determining the longitudinal modulus of elasticity E is preferably Teflon, of which longitudinal modulus of elasticity at a temperature around 240° C. does not change in an unlinear form. However, an elastic material similar to Teflon having a most suitable value can be selected in consideration of a relationship with the dimensions of the elastic material.

When the semiconductor device is manufactured in accordance with the sequential steps of the manufacturing process illustrated in FIG. 5 in use of the above-mentioned supporting jig 23, the semiconductor device (MCP) illustrated in FIG. 1 can be manufactured so as to have a good quality.

Eaxample 1

The semiconductor chips 10 and 12, obtained by dividing (dicing) a wafer, on which a plurality of memory semiconductor chips having center pads, abraded to a thickness of 0.200 mm, into individuals, and a frame having a thickness of 0.125 mm are used. The thickness of a first joining material for joining back surfaces of the semiconductor chips each other is 0.015 mm. A second joining material has a thickness of 0.035 mm and joins an inner lead to the semiconductor chip.

In use of the above-mentioned constitutional elements according to the method of manufacturing the semiconductor device described in Embodiment 1, the thickness of the laminated semiconductor chip is B=0.415 mm. In the next, a metallic wire having a diameter of 0.030 mm is bonded so that the height of a first loop is A=0.220 mm, and the height of a second loop is A=0.51 mm. In this case, D is made constant to be 0.09 mm a dimension C of a step between a ball bond and a stitch bond is C=0.125+0.035=0.160 mm in the first wire bond, and C=0.415+0.035=0.450 in the second wire bond. A top end portion of the metallic wire is sealed by a sealing resin 17 having a thickness of 0.136 mm, a total thickness of the sealing resin of the semiconductor device is the thickness of the sealing resin 17 in the top end portion of the metallic wire+C+B+D+the thickness of the sealing resin 17 in the top end portion of the metallic wire=0.997 mm, which is smaller than 1 mm.

Example 2

A laminated semiconductor chip is fabricated such that the diameter of a metallic wire is 0.03 mm, a dimension from a top end portion of the metallic wire to an upper surface of a sealing resin is 0.08 mm, and the thicknesses of the semiconductor chips 10 and 12 are abraded to be 0.150 mm, whereby the thickness of the semiconductor device is 0.785 mm.

In use of the structure described in the Embodiment according to the method of manufacturing the semiconductor device, as an abrading technology and a sealing technology are advanced in future to reduce every dimension of A, B, D, and a sealing resin, covering a top end portion of a wire, a requirement that a thickness of a sealing resin of a semiconductor device, in which a laminated semiconductor chip is sealed, is 1 mm or less can be easily achieved to provide a good quality and similar effects with ease.

As a condition of constructing the semiconductor device described in the Embodiment, the stitch bond is positioned between the ball bond of the metallic wire and the top end portion of the metallic wire, i.e. a relationship A=C+D, illustrated in FIG. 4, is maintained. Forward wire bonding or adverse wire bonding is selected, and especially adverse wire bonding is applied to a side having a larger step, whereby effects similar to described above can be demonstrated.

Further, the two semiconductor chips having the same sizes are attached back to back in the above. However, effects similar to described above can be demonstrated by fabricating a laminated semiconductor chip in use of two semiconductor chips having different sizes.

Further, in the first wire bonding step, although the inner lead is fixed by interposing peripheries of the inner lead by the securing jig and directly receiving the principle surface of the semiconductor chip in the downward direction on the machined surface of the supporting jig, there is a case that the laminated semiconductor chip is not stabilized, and a quality of the wire bond is not stabilized. Therefore, it is necessary to completely fix the inner lead with a large force by the supporting jig and the securing jig. As a result, the force is applied to the principle surface of the semiconductor chip in contact with the supporting jig, whereby there is a danger that the surface of the chip is damaged. By making the principle surface of the semiconductor chip on the supporting jig in contact with the buffer material, the insulating layer on the surface of the chip is prevented from being damaged, and the wire bond is secured.

In the second wire bonding step, the first semiconductor chip positioned in the downward direction already has the wire bond. Therefore, the first surface of the inner lead is received by the supporting jig having the recessed portion of the dimension E in the outer side of the portion of the inner lead subjected to stitch bonding, and the second surface of the inner lead is firmly pressed by the securing jig so as to be fixed, whereby the principle surface of the first semiconductor chip is not in contact with the supporting jig to avoid damages. Further, the joining material is interposed between the inner lead and the principle surface of the semiconductor chip. The joining material works as a buffer material against a load caused at time of stitch bonding, whereby the principle surface of the semiconductor chip is not damaged, and a secure wire bond is obtainable.

The first advantage of the semiconductor device according to the present invention is that the thickness of the sealing resin can be made thin.

The second advantage of the semiconductor chip according to the present invention is that the memory capacity can be doubled.

The third advantage of the semiconductor device according to the present invention is that a quality of joints of the metallic wire is good.

The advantage of the method of manufacturing the semiconductor device according to the present invention is that a quality of the joints of the metallic wire can be further improved.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2001-147476 filed on May 17, 2001 including specification, claims, drawings and summary are incorporated herein by reference in its entirety.

What is claimed is:

1. A semiconductor device comprising:
    a laminated semiconductor chip assembly including a first semiconductor chip and a second semiconductor chip, having respective principal surfaces having pads and back surfaces, the back surface of the first semiconductor chip being laminated to the back surface of the second semiconductor chip with a first joining material;
    a lead frame integrally having an inner lead with first and second surfaces and an outer lead;
    a second joining material;
    metallic wires; and
    a sealing resin, wherein
        a second surface of the inner lead is fixed to the principal surface of the first semiconductor chip with the second joining material,
        a first of the metallic wires is bonded to the second surface of the inner lead and to a pad on the second semiconductor chip by reverse wire bonding,
        a second of the metallic wires is bonded to a pad on the first semiconductor chip and the first surface of the inner lead by forward wire bonding,
        the inner lead, the semiconductor chip assembly, the metallic wires, and the second joining material are covered by the sealing resin, and
        the outer lead protrudes from the sealing resin.

2. The semiconductor device according to claim 1, wherein the laminated semiconductor chip assembly is a semiconductor memory chip.

* * * * *